(12) United States Patent
Chudzik et al.

(10) Patent No.: US 9,257,519 B2
(45) Date of Patent: Feb. 9, 2016

(54) SEMICONDUCTOR DEVICE INCLUDING GRADED GATE STACK, RELATED METHOD AND DESIGN STRUCTURE

(71) Applicant: GLOBALFOUNDRIES INC., Grand Cayman (KI)

(72) Inventors: Michael P. Chudzik, Ridgefield, CT (US); Min Dai, Mahwah, NJ (US); Jinping Liu, Hopewell Junction, NY (US); Joseph F. Shepard, Jr., Poughkeepsie, NY (US); Keith K. H. Wong, Wappingers Falls, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 14/081,417

(22) Filed: Nov. 15, 2013

(65) Prior Publication Data

US 2014/0070334 A1    Mar. 13, 2014

Related U.S. Application Data

(62) Division of application No. 13/453,131, filed on Apr. 23, 2012, now abandoned.

(51) Int. Cl.
| | |
|---|---|
| *H01L 29/66* | (2006.01) |
| *H01L 21/02* | (2006.01) |
| *H01L 21/336* | (2006.01) |
| *H01L 29/49* | (2006.01) |
| *H01L 29/47* | (2006.01) |
| *H01L 21/28* | (2006.01) |
| *H01L 29/51* | (2006.01) |

(52) U.S. Cl.
CPC ...... *H01L 29/4966* (2013.01); *H01L 21/28202* (2013.01); *H01L 29/47* (2013.01); *H01L 29/51* (2013.01); *H01L 29/513* (2013.01); *H01L 29/517* (2013.01); *H01L 29/518* (2013.01)

(58) Field of Classification Search
CPC .. H01L 29/66545; H01L 29/78; H01L 29/517
USPC ............... 257/101, 185, 191, 325, 335, 548; 438/37, 87, 281, 591
See application file for complete search history.

(56) References Cited

U.S. PATENT DOCUMENTS

| | | | | | |
|---|---|---|---|---|---|
| 5,637,514 | A | * | 6/1997 | Jeng | ............... H01L 29/6656 257/E29.266 |
| 6,020,243 | A | * | 2/2000 | Wallace | ............ H01L 21/28185 257/213 |
| 6,100,559 | A | * | 8/2000 | Park | ................ H01L 21/28061 257/314 |
| 6,207,995 | B1 | * | 3/2001 | Gardner | ............ H01L 21/28194 257/344 |
| 6,297,106 | B1 | * | 10/2001 | Pan | .................... H01L 21/28114 257/E21.193 |
| 6,451,658 | B2 | * | 9/2002 | Akram et al. | ................ 438/299 |

(Continued)

OTHER PUBLICATIONS

U.S. Appl. No. 13/452,131, Office Action dated Mar. 20, 2014.

(Continued)

*Primary Examiner* — Long K Tran
*Assistant Examiner* — Thai T Vuong
(74) *Attorney, Agent, or Firm* — Anthony J. Canale; Hoffman Warnick LLC

(57) ABSTRACT

A semiconductor device is disclosed. The semiconductor device includes a substrate; and a gate structure disposed directly on the substrate, the gate structure including: a graded region with a varied material concentration profile; and a metal layer disposed on the graded region.

8 Claims, 10 Drawing Sheets

(56) References Cited

U.S. PATENT DOCUMENTS

| | | | |
|---|---|---|---|
| 6,770,923 B2 | 8/2004 | Nguyen et al. | |
| 6,911,707 B2 | 6/2005 | Gardner et al. | |
| 7,084,038 B2 | 8/2006 | Doczy et al. | |
| 7,105,886 B2 | 9/2006 | Droopad | |
| 7,198,999 B2 | 4/2007 | Forbes | |
| 7,709,909 B2 | 5/2010 | Doczy et al. | |
| 7,776,701 B2 | 8/2010 | Callegari et al. | |
| 2001/0041250 A1* | 11/2001 | Werkhoven | C23C 16/029 428/212 |
| 2002/0022325 A1* | 2/2002 | Gardner | H01L 21/28185 438/287 |
| 2002/0048910 A1* | 4/2002 | Taylor, Jr. | H01L 21/823807 438/486 |
| 2002/0061637 A1* | 5/2002 | Wang | H01L 21/28061 438/586 |
| 2005/0260357 A1* | 11/2005 | Olsen et al. | 427/569 |
| 2007/0018214 A1* | 1/2007 | Ahn | C23C 14/545 257/295 |
| 2007/0048953 A1* | 3/2007 | Gealy | C23C 16/45529 438/305 |
| 2007/0102776 A1* | 5/2007 | Pan | H01L 21/28088 257/411 |
| 2009/0195152 A1* | 8/2009 | Sawano | 313/504 |
| 2010/0078738 A1 | 4/2010 | Chambers et al. | |
| 2010/0320476 A1* | 12/2010 | Cheng | H01L 29/8083 257/77 |
| 2011/0256718 A1 | 10/2011 | Haukka et al. | |

OTHER PUBLICATIONS

Chowdhury et al., High-k Dielectrics for Submicron MOSFET, Jul. 2010, pp. 1-12, vol. 2, IJETSE.

Kang et al., Scaling down of ultrathin HfO2 gate dielectrics by using a nitrided Si surface, Apr. 16, 2004, pp. 916-919 American Vacuum Society.

Kirsch et al. Nucleation and growth study of atomic layer deposited HfO2 gate dielectrics resulting in improved scaling and electron mobility, 2006, 9 pages, American Institute of Physics.

U.S. Appl. No. 13/453,131, Office Action dated Aug. 14, 2013.

* cited by examiner

SEMICONDUCTOR DEVICE INCLUDING GRADED GATE STACK, RELATED METHOD AND DESIGN STRUCTURE

CROSS-REFERENCE TO RELATED APPLICATIONS

This application is a divisional of currently pending U.S. patent application Ser. No. 13/453,131 filed on Apr. 23, 2012. The application identified above is incorporated herein by reference in its entirety for all that it contains in order to provide continuity of disclosure.

TECHNICAL FIELD

Embodiments of this disclosure relate generally to semiconductor devices and, more particularly, to a semiconductor device including a graded metal and/or graded high dielectric constant (high-K) gate stack, a related method and design structure.

BACKGROUND

In semiconductor devices, graded regions (e.g., regions with a varying composition of silicon, silicates, metals, etc.) are frequently included adjacent to or as a part of gate elements to decrease device size and increase device performance. The use and effectiveness of these graded regions in devices may be impacted by the composition, scaling, and/or gradation of the graded regions themselves. Traditionally, graded regions (e.g., dielectric materials) may be formed by a high temperature anneal which generates a material concentration variation within the graded region. However, in these methods, the high temperature anneal may complicate the process flow, require additional process chambers for the anneal, fail to create a fully graded region, and/or damage other components in the semiconductor device. Further, this high temperature annealing may diminish film quality and be unable to control the profile of the graded region, limiting profile design and future scaling options for the semiconductor devices. To accommodate this high temperature anneal, some methods include an interface layer disposed between the dielectric and the substrate. The inclusion of an additional interface in the semiconductor devices may increase fixed charges and limit mobility.

BRIEF SUMMARY

A first aspect of the disclosure provides a semiconductor device including: a substrate; and a gate structure disposed directly on the substrate, the gate structure including: a graded region with a varied material concentration profile; and a metal layer disposed on the graded region.

A second aspect of the disclosure provides a method of forming a semiconductor device, the method including: providing a substrate; forming a graded region directly upon a portion of the substrate, the graded region including a varied material concentration profile; and introducing nitrogen into the graded region to control the varied material concentration profile.

A third aspect of the disclosure provides a design structure tangibly embodied in a machine readable medium for design, manufacturing, or testing a semiconductor device, the design structure including: a substrate; and a gate structure disposed directly on the substrate, the gate structure including: a graded region with a varied material concentration profile; and a metal layer disposed on the graded region.

These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

The above and other aspects, features and advantages of the invention will be better understood by reading the following more particular description of the invention in conjunction with the accompanying drawings.

Figure 1:
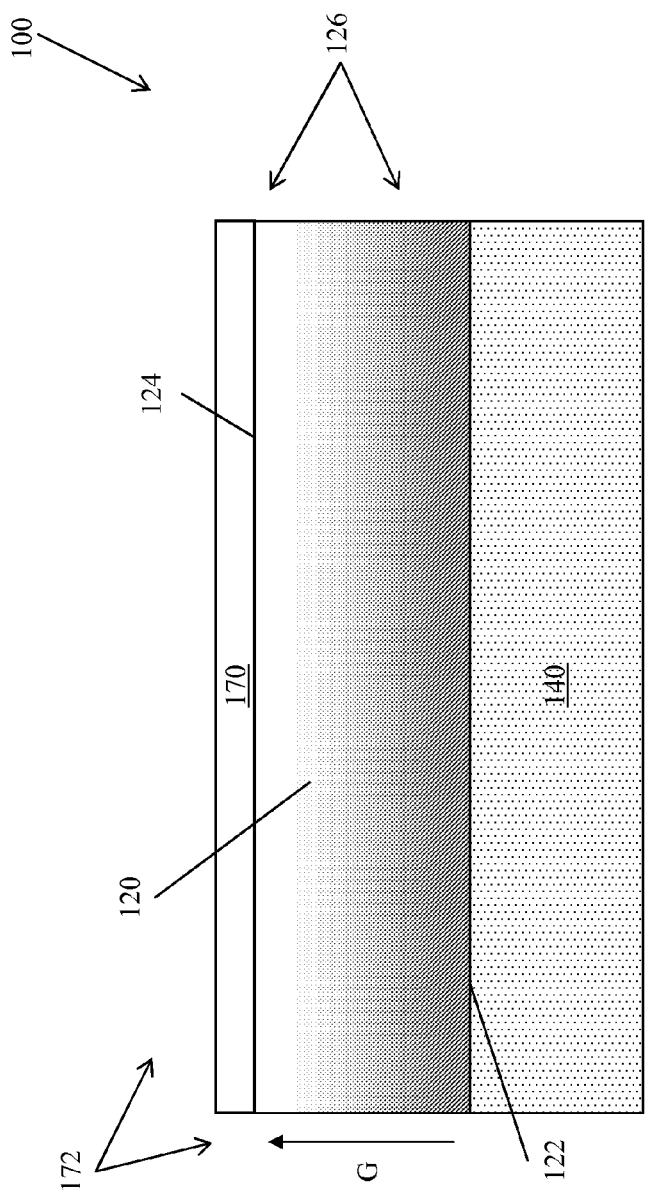
FIG. 1 is a demonstrative illustration of a portion of a semiconductor device according to an embodiment of the invention.

It is noted that the drawings of the disclosure are not necessarily to scale. The drawings are merely schematic representations, not intended to portray specific parameters of the invention. The drawings are intended to depict only typical embodiments of the invention, and therefore should not be considered as limiting the scope of the invention. It is understood that in embodiments shown and described in the drawings, like numbering may represent like elements and that redundant explanation of these elements has been omitted for clarity. Finally, it is understood that the components of the drawings and their accompanying descriptions may be applied to any embodiment described herein.

DETAILED DESCRIPTION

FIG. 1 is a demonstrative illustration of a cross sectional view of a portion of a semiconductor device 100 according to embodiments of the invention. Semiconductor device 100 may include a substrate 140, with a graded region 120 defined and/or formed thereon. Graded region 120 may include a plurality of materials and have a chemical concentration of material(s) which varies within the region to form a varied material concentration profile 'G.' A metal layer 170 may be disposed on graded region 120 forming a metal gate 172.

Graded region 120 may include a first portion 122 in contact with substrate 140, and a second portion 124 disposed above substrate 140 and first portion 122. In one embodiment, graded region 120 may include a high dielectric constant (high-K dielectric) region (e.g., a region with a high degree of permittivity relative other materials in semiconductor device 100). A concentration of the material(s) which comprise graded region 120 may vary gradually, linearly, incrementally, or exponentially between first portion 122 and second portion 124. In one embodiment, composition of graded region 120 at first portion 122 may be substantially silicon and composition of graded region 120 at second portion 124 may be substantially metal. In contrast to conventional techniques, graded region 120 may be deposited and/or formed directly on substrate 140 without an interface layer. In one embodiment, graded region 120 may form a gate structure 126. Silicates, metals and/or metal oxides may be deposited as part of graded region 120. As used herein, the term "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser-assisted deposition, thermal oxidation, thermal nitridation, spin-on methods, physical vapor deposition (PVD), atomic layer deposition (ALD), chemical oxidation, molecular beam epitaxy (MBE), plating, evaporation, etc.

In any event, graded region 120 may be formed as a set of films (shown in FIG. 15) with a composition which is manipulated to generate a varied material concentration profile 'G' for graded region 120. Graded region 120 may have a material concentration profile G which is defined by Equation 1 below, where the material composition at a given point of graded region 120 is determined by:

$$\text{Material Composition} = M_X Si_{1-X} O_y \qquad \text{Eq. 1}$$

Where M is the metal composition (e.g., Aluminum, Magnesium, etc.) of graded region 120 at a given point 'X', Si the silicon composition of graded region 120 at given point X, and $O_y$ the oxide composition of graded region 120 at given point X. In one embodiment, graded region 120 may include (e.g., contain) at least one of: aluminum (Al), magnesium (Mg), lanthanum (La), aluminum oxide ($Al_2O_3$), lanthanum oxide ($La_2O_3$), and zirconium oxide ($Zr_2O_3$). It is understood that while specific material examples for graded region 120 are described herein, graded region 120 may include any combination of now known or later developed materials which provide the features described herein. For instance, metal composition M may include a plurality of metals (e.g., Aluminum, Hafnium Oxide ($HfO_2$), Magnesium, etc.).

Further, graded region 120 may include any commonly used dielectric and/or gate material including but not limited to polysilicon or high melting point refractory metals, such as W, Ti, Ta, Mo, Nb, Re, Ru and their binary or ternary metallic derivatives, e.g., WN, TiN, TaN, MoN, MoO2, TaSiN. Further, graded region 120 may comprise a gate structure 126 on semiconductor substrate 140. Graded region 120 may comprise any commonly used gate dielectric material including but not limited to oxide, nitride, oxynitride, and high-k materials such as hafnium silicate, zirconium silicate, hafnium dioxide, and zirconium dioxide. Further, graded region 120 may include silicon dioxide ($SiO_2$), silicon nitride (SiN), or any other material now known or later developed. Any number of dielectric regions may be located over the substrate, as many other layers included in semiconductor chips now known or later developed. In one embodiment, graded region 120 may include silicon dioxide ($SiO_2$) for its insulating, mechanical and optical qualities. Graded region 120 may also include, but is not limited to: silicon nitride ($Si_3N_4$), fluorinated $SiO_2$ (FSG), hydrogenated silicon oxycarbide (SiCOH), porous SiCOH, boro-phosho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

In an embodiment, graded region 120 may be formed via a low temperature process which decreases the thermal budget of semiconductor device 100 and eliminates the need for an interface layer to thermally insulate substrate 140, thereby making semiconductor device 100 replacement metal gate (RMG) compatible. Graded region 120 may include a first portion 122 adjacent substrate 140 which is substantially dielectric and a second portion 124 which is substantially metal. The controllable composition profile engineering provided by graded region 120 may enable linear and/or exponential gradation and variation of material concentration between first portion 122 at substrate 140 and second portion 124. Use of graded region 120 may form a natural film stack between substrate 140 and the top of metal gate 172, eliminating the interface formed by an interface layer. In one embodiment, graded region 120 may be formed via an in-situ process (e.g., in the same process chamber used to perform other processes of forming semiconductor device 100) as a portion of the formation of semiconductor device 100. Graded region 120 may be used to scale the leakage current and equivalent oxide thickness (EOT) of semiconductor device 100 via optimization, design and control of the material concentration profile G of semiconductor device 100. Further, through material compositions control and scaling, graded region 120 may be engineered to reduce the fixed charge and improve mobility via reduction of layer interfaces in semiconductor device 100. The transitory material concentration profile G of graded region 120 reduces the number of interfaces between layers of semiconductor device 100, providing a gradual transition between substrate 140 and metal layer 172.

In one embodiment, nitrogen plasma and/or a rapid thermal (RT) ammonia ($NH_3$) anneal may be used to introduce Nitrogen into graded region 120 with desired profiles. This introduction may be included as a part of a nitridation process for graded region 120. During an $NH_3$ anneal, the material concentration profile G of graded region 120 may be controlled by manipulating at least one of a temperature, a pressure, and a duration of the $NH_3$ anneal. For a plasma nitridation process, the material concentration profile G of graded region 120 may be controlled by manipulating at least one of a power, a pressure, and a temperature of the plasma process. Further, a post anneal may be used following the plasma process for additional Nitrogen profile engineering. In one embodiment, the material concentration profile G may be controlled by performing a series of nitridation and deposition processes with varying Nitrogen contents (e.g., separating nitrogen deposition into several stages of deposition divided by nitridation processes).

Substrate 140 can comprise any commonly used substrate material including but not limited to silicon, germanium, silicon germanium, silicon carbide, and those consisting essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Substrate 140 may also be comprised of Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The processes to provide substrate 140, as illustrated and described, are well known in the art and thus, no further description is necessary.

Figure 2:
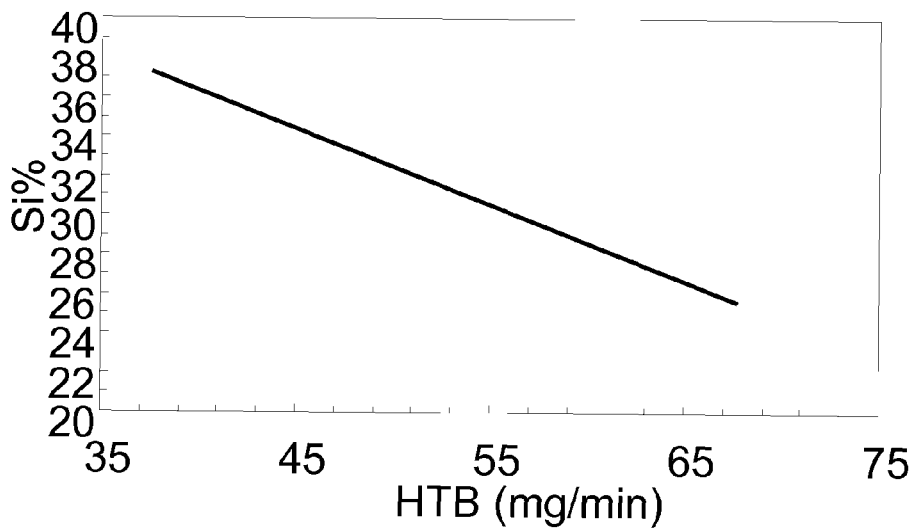
FIG. 2 is a demonstrative illustration of a graphical representation of a profile of a portion of a semiconductor device according to an embodiment of the invention.

Turning to FIG. 2, a demonstrative illustration of a graphical representation of a material concentration profile of a graded region 120 is shown according to embodiments of the invention. In this embodiment, graded region 120 includes a material concentration profile which is Silicon (Si) rich at a proximity to substrate 140 (e.g., first portion 122) and becomes Hafnium (Hf) rich proximate an extremity of graded region 120 opposite substrate 140 (e.g., second portion 124). The material profile of graded region 120 may be represented by equation 2 below:

$$\text{Material Composition} = Hf_X Si_{1-X} O_y \qquad \text{Eq. 2}$$

Figure 3:
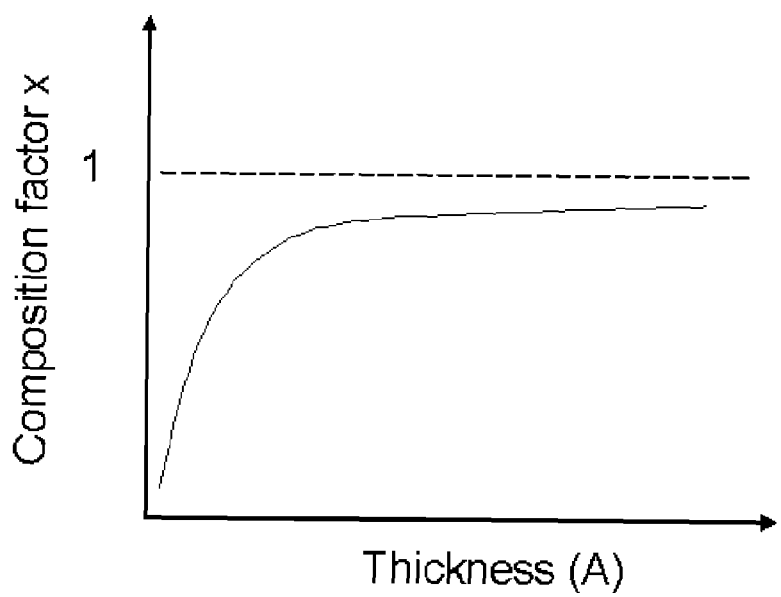
FIG. 3 is a demonstrative illustration of a graphical representation of a profile of a portion of a semiconductor device according to an embodiment of the invention.

As can be seen in FIG. 2, as the amount of Hf in graded region 120 increases the percentage of Si decreases. During the formation of this graded $HfO_2$ dielectric (e.g., graded region 120), varying the material deposition composition relative a position 'X' in graded region 120, results in deposition of a controlled graded film with scaled equivalent oxide thickness (EOT). Turning to FIG. 3, a graphical representation of a material concentration profile of a graded region 120 is shown according to embodiments of the invention. In this embodiment, graded material includes a non-linear material concentration profile which is Si rich proximate first portion 122, and varies exponentially between first portion 122 and second portion 124, becoming Hf rich proximate an extremity of graded region 120 opposite substrate 140.

Figure 4:
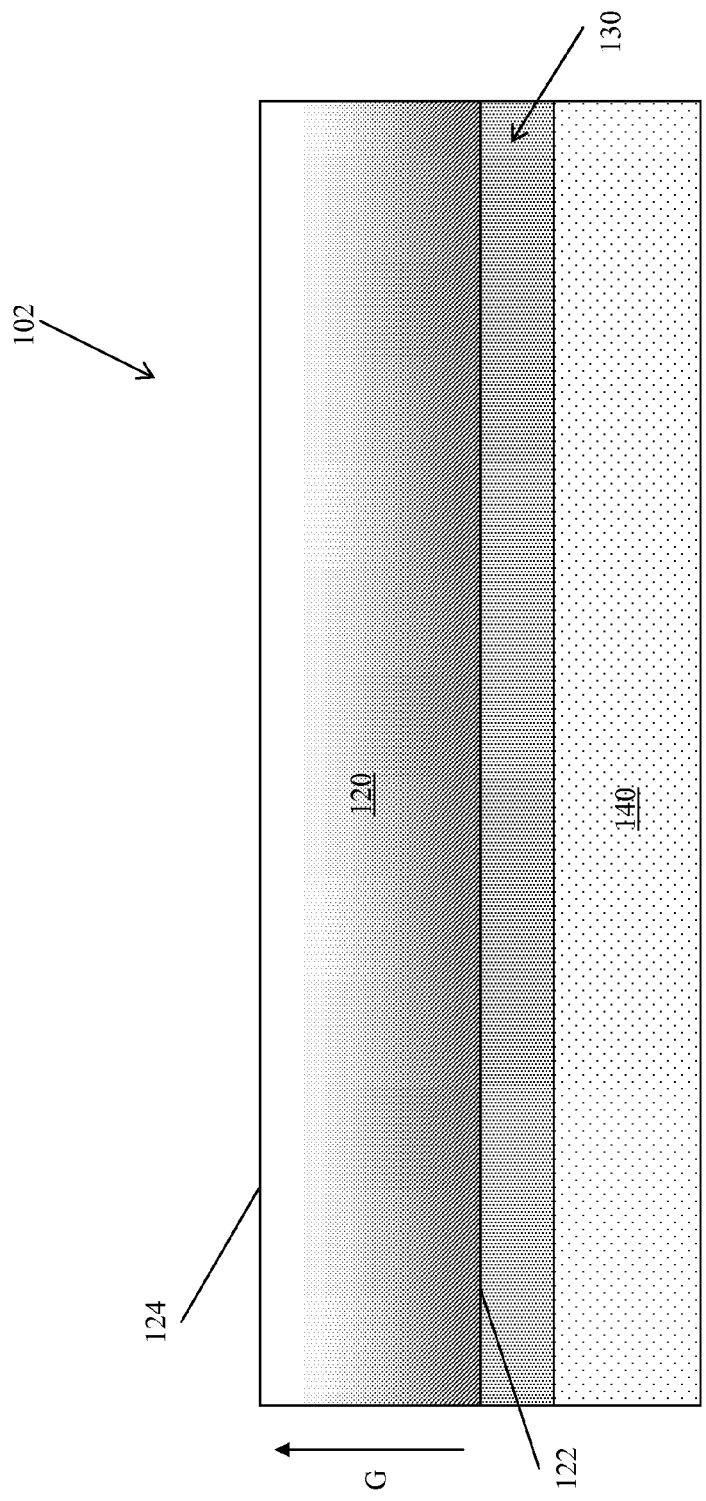
FIG. 4 is a demonstrative illustration of a portion of a semiconductor device according to an embodiment of the invention.

Turning to FIG. 4, a demonstrative illustration of a cross sectional view of a portion of a semiconductor device 102 is shown according to embodiments of the invention. In this embodiment, semiconductor device 102 includes an interface layer 130 disposed between substrate 140 and graded region 120.

FIGS. 5-8 are demonstrative illustrations of a device undergoing a method according to embodiments of the invention. Although FIGS. 5-8 show the method of forming a portion of semiconductor device 100 in FIG. 1, it is understood that a similar method may be employed to form semiconductor device 102 of FIG. 4, or any other like semiconductor device.

Figure 5:
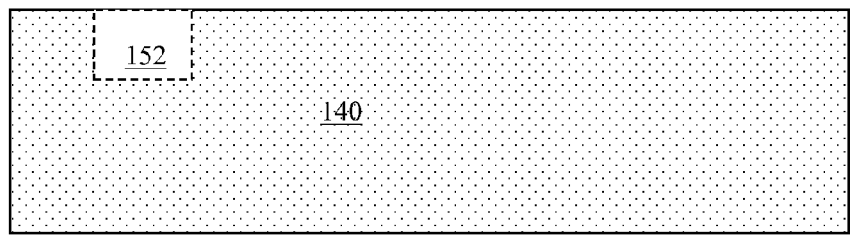
FIGS. 5-8 are demonstrative illustrations of a method of forming a semiconductor device according to embodiments of the invention.

Turning to FIG. 5, a demonstrative illustration of a substrate 140 in semiconductor device 100 is shown in preparation for deposition of layers. Substrate 140 may include silicon or any other material commonly known and may be chemically cleaned. In one embodiment, a trench 152 (shown in phantom) may be etched in substrate 140. Trench 152 may be etched using any now known or later developed etching techniques. In one embodiment, etching of substrate 140 may be performed using a reactive ion etch (RIE). As is known in the art of semiconductor fabrication, RIE uses chemically reactive plasma to remove material deposited on wafers/substrates. Differences in width between these openings may allow for utilizing a phenomenon known as inverse RIE lag. Inverse RIE lag, as is known in the art of semiconductor fabrication, causes a faster etch rate in narrower openings (higher aspect ratios) than in openings having larger widths (lower aspect ratios). Inverse RIE lag may be induced under any conditions characterized by high polymerization and high wafer self-bias voltages. In one embodiment, conditions characterized by high polymerization, may include general chemistries such as CxHyFz (Carbon-Hydrogen-Flourine) with high oxide-to-nitride selectivity (where the blanket etch rate ratio is greater than approximately 20:1). In another embodiment, conditions characterized by high polymerization may include $O_2$ (oxygen), a dilutant, and one or more of: $C_4F_6$, $C_5F_8$, or $C_4F_8$. In this case, the dilutant may be, for example, Argon (Ar). High wafer self-bias voltages may, for example, be voltages greater than approximately 500 volts. While specific conditions for facilitating inverse RIE lag are described herein, those conditions are merely illustrative. Inverse RIE lag may be induced under other conditions not specifically described herein.

Figure 6:
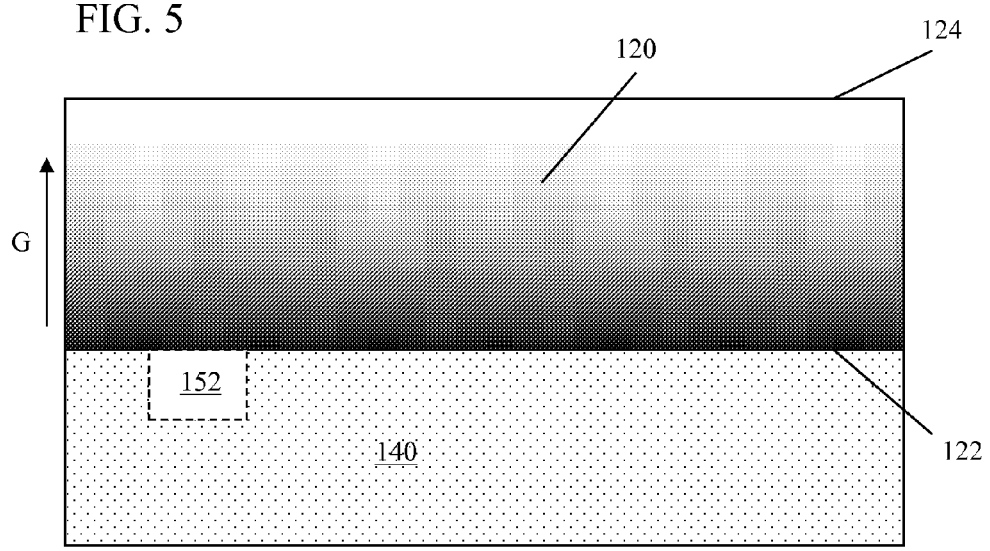

Next, in FIG. 6, a demonstrative illustration of graded region 120 is shown deposited on substrate 140. In one embodiment, graded region 120 may be deposited as a set of films on substrate 140, the films having a varied material composition relative to desired material concentration profile G. For example, composition of graded region 120 at first portion 122 may be substantially silicon and composition of graded region 120 at second portion 124 may be substantially metal. Graded region 120 having a varied chemical composition between first portion 122 and second portion 124 based on a relative position to material concentration profile G, this variation including varying amounts of silicon and metal. In any event, following deposition of graded region 120, semiconductor device 100 may be polished to develop the surfaces.

Figure 7:
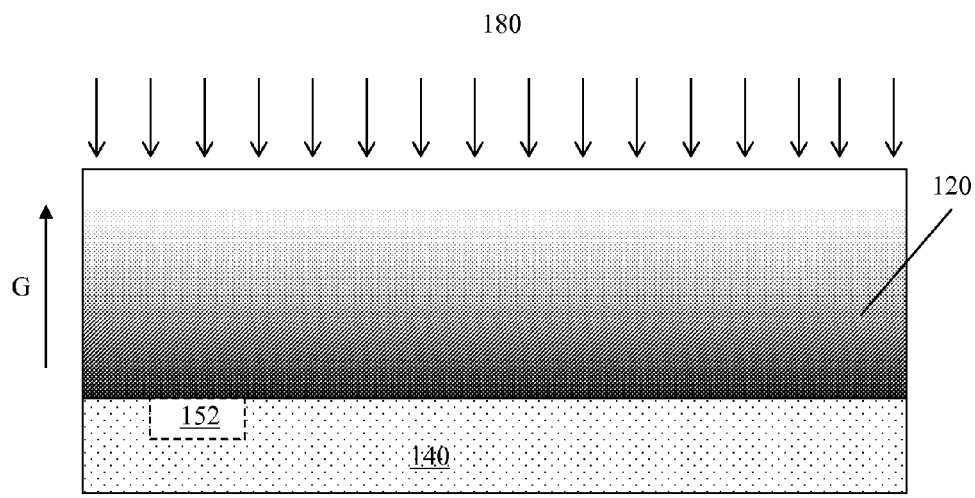

Next, in FIG. 7, a demonstrative illustration is shown where graded region 120 may optionally be subjected to Nitrogen (N) plasma and/or RT $NH_3$ annealing 180 to introduce desired N profiles in graded region 120 and semiconductor device 100. This optional introduction of N further engineers material concentration profile G.

Figure 8:
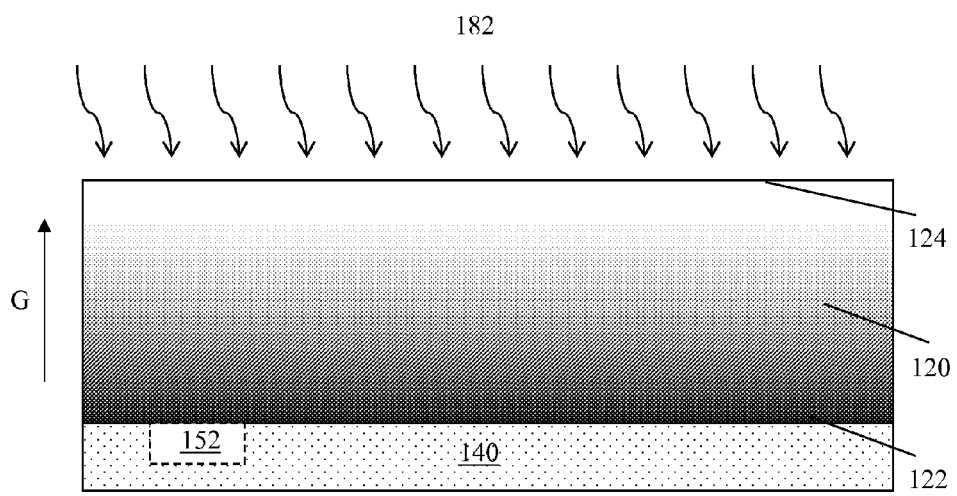
Figure 9:
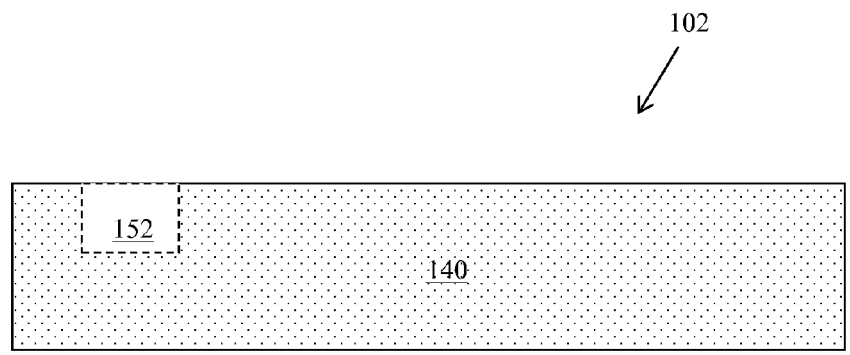
FIGS. 9-14 are demonstrative illustrations of a method of forming a semiconductor device according to embodiments of the invention.

Turning now to FIG. 8, following the N introduction, a thermal anneal 182 may optionally be applied to semiconductor device 100 to stabilize the films that comprise graded region 120. Stabilization of the films may produce semiconductor device 100 of FIG. 1 which includes a gate structure 126 formed by graded region 120. Gate structure 126 may include a first portion 122 contacting substrate 140 and comprising substantially silicon (e.g., about 100% silicon), and a second portion 124 forming the top of gate structure 126 and comprising substantially metal (e.g., about 100% aluminum). Transition of material concentration/composition through graded region 120 between first portion 122 and second portion 124 may be linear (e.g., natural, gradual or incremental as shown in FIG. 2), exponential (e.g., irregular or varying as shown in FIG. 3), or any other form of gradation or transition known.

FIGS. 9-14 are demonstrative illustrations of a semiconductor device 102 (FIG. 4) undergoing processes according to a method in accordance with another embodiment of the invention. In this method an interface layer 130 is formed as a layer of semiconductor device 102. Although FIGS. 9-14 are demonstrative illustrations of the method of forming a portion of semiconductor device 102 in FIG. 4, it is understood that a similar method may be employed to form semiconductor device 100 of FIG. 1, or any other like semiconductor device.

Returning to FIG. 9, a demonstrative illustration of a cross-sectional view of semiconductor device 102 undergoing a process according to embodiments is shown. In one embodiment, a trench 152 (shown in phantom) may be etched in substrate 140. As discussed herein, trench 152 may be etched using any now known or later developed etching techniques.

Figure 10:
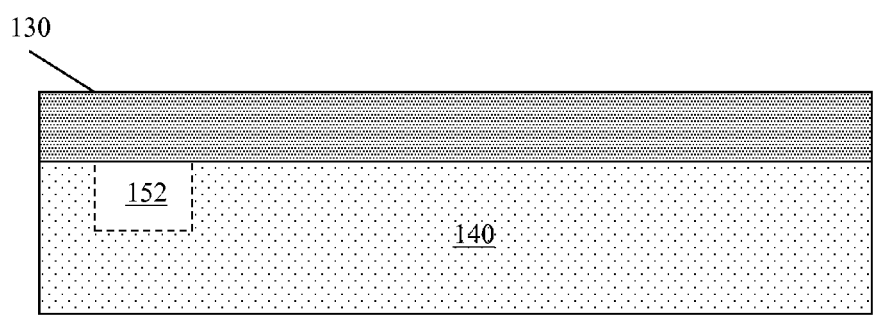

Next, in FIG. 10, a demonstrative illustration is shown of an interface layer 130 being deposited on substrate 140 to form an interface between substrate 140 and graded region 120.

Figure 11:
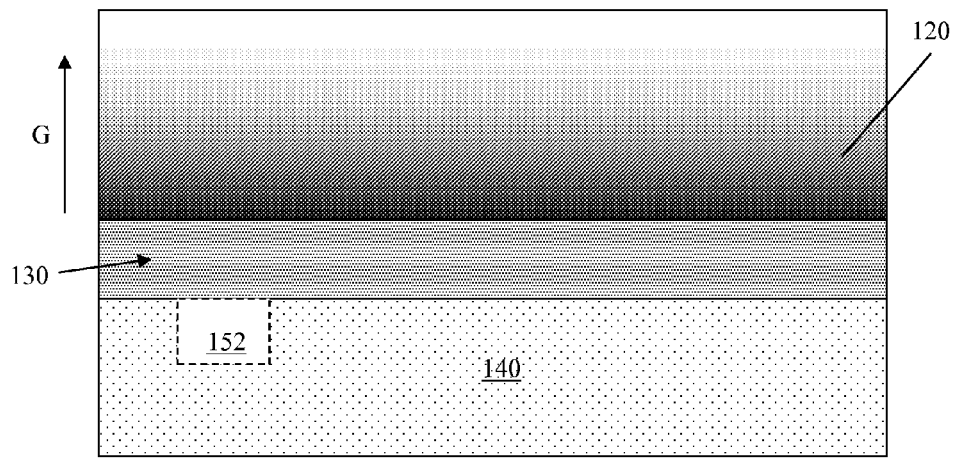
Figure 12:
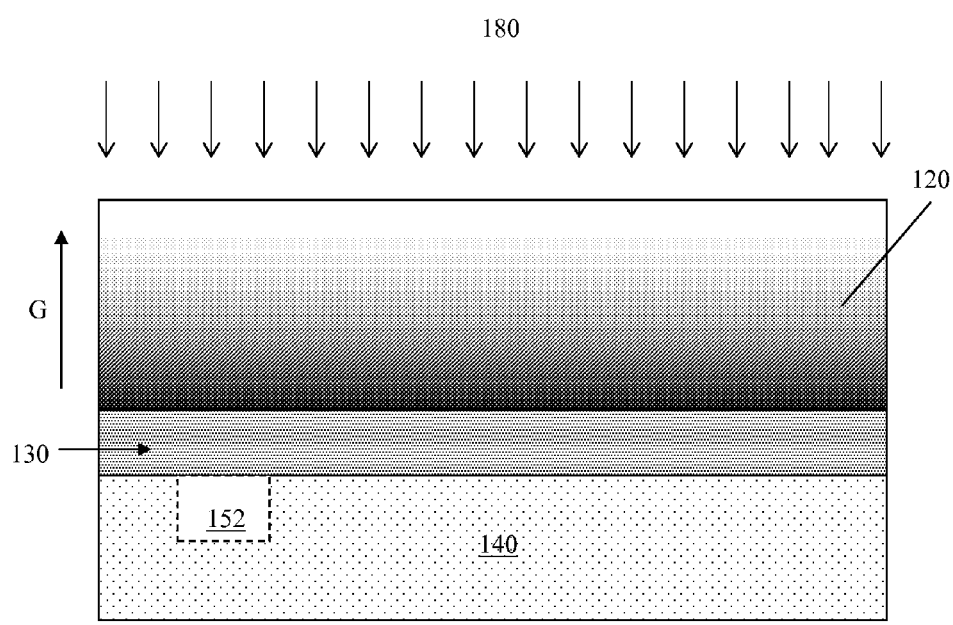

Following deposition of interface layer 130, in FIG. 11, graded region 120 is deposited on substrate 140. Graded region 120 may be deposited via PVD, ALD, CVD or any other known deposition techniques. In one embodiment, graded region 120 may be deposited as a set of films on substrate 140, the set of films having a varied material composition relative one another and being deposited in accordance with material concentration profile G. Following deposition of graded region 120, semiconductor device 100 may be polished to develop the surfaces. After deposition of graded region 120, as can be seen in FIG. 12, graded region 120 may optionally be subjected to N plasma and/or RT $NH_3$ annealing 180 to introduce desired N profiles in graded region 120 and semiconductor device 100.

Figure 13:
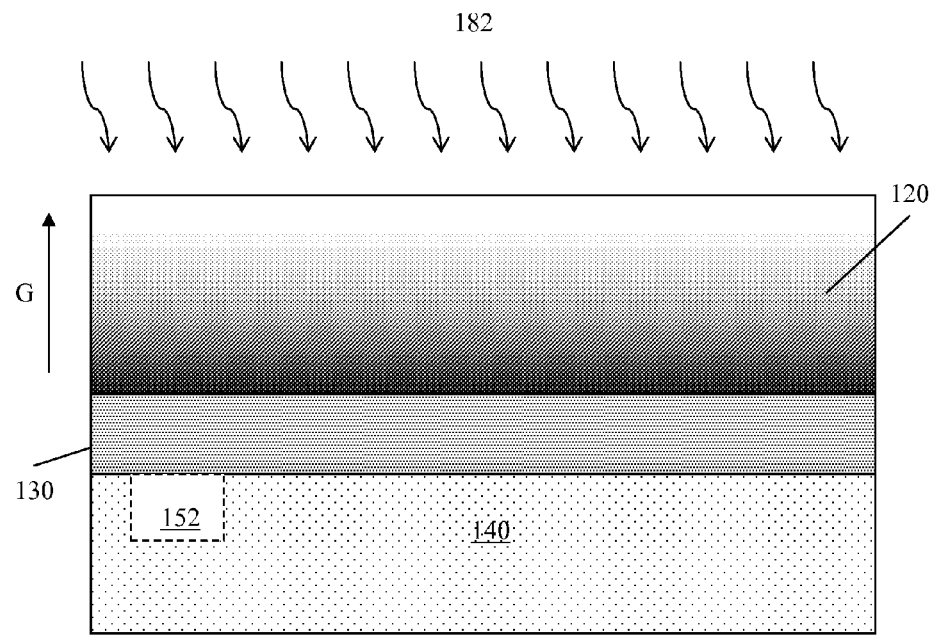
Figure 14:
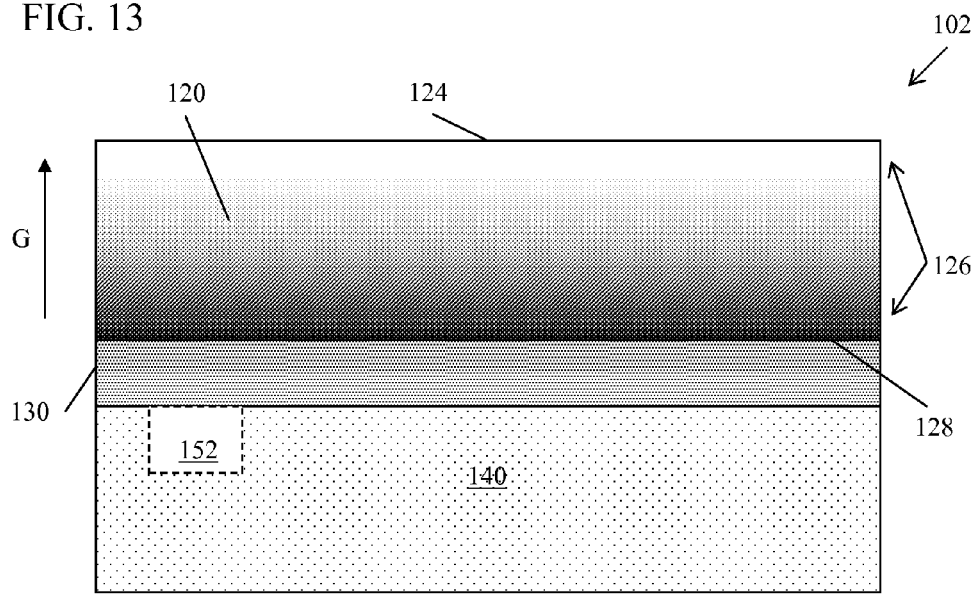

Turning now to FIG. 13, following the N introduction, a thermal anneal 182 may optionally be applied to semiconductor device 100 to stabilize the films that comprise graded region 120. Stabilization of the films may produce semiconductor device 102 of FIG. 14 which includes a trench 152 disposed beneath gate structure 126 formed by graded region 120. Gate structure 126 may include a first portion 128 contacting interface layer 130 and comprising substantially silicon (e.g., about 100% silicon), and a second portion 124 forming the top of the gate and comprising substantially metal (e.g., about 100% aluminum). Transition of material concentration/composition through graded region 120 between first portion 128 and second portion 124 may be linear (e.g., gradual or incremental as shown in FIG. 2), exponential (e.g., irregular or varying as shown in FIG. 3), or any other form of gradation or transition known.

Figure 15:
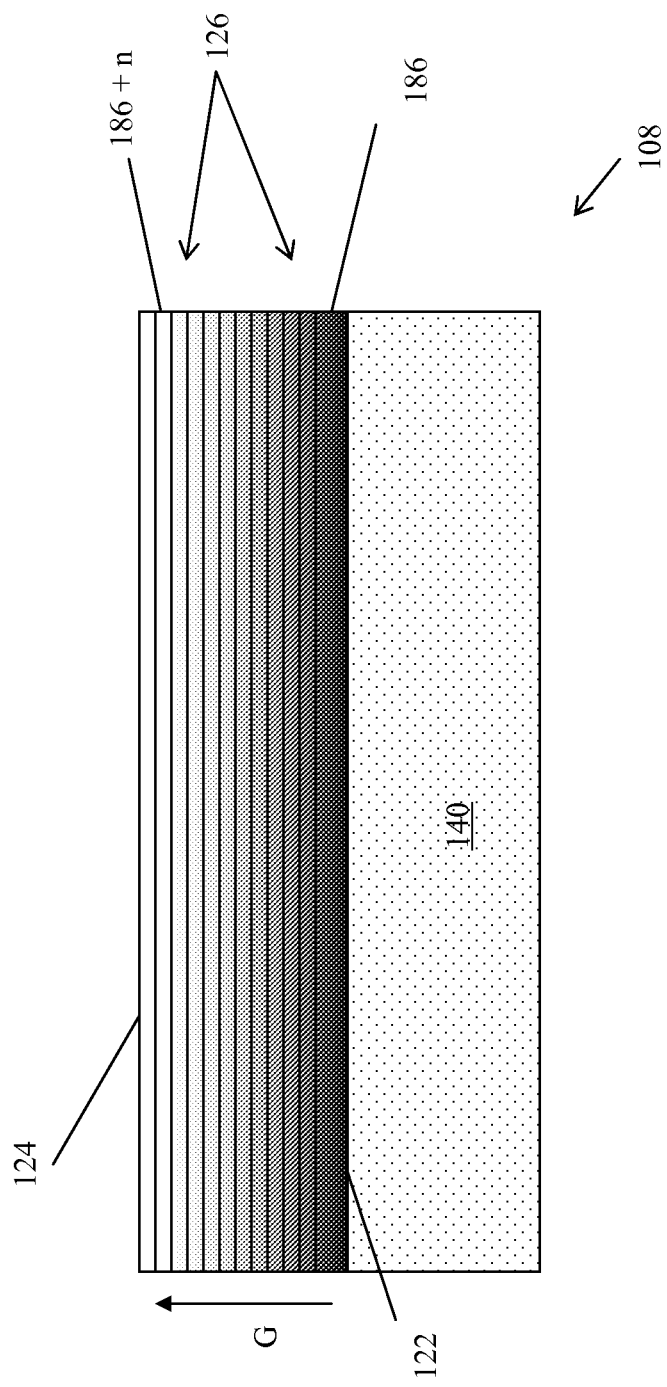
FIG. 15 is a demonstrative illustration of a portion of a semiconductor device according to an embodiment of the invention.

Turning to FIG. 15, a demonstrative illustration of a cross sectional view of a portion of a semiconductor device 108 is shown according to embodiments of the invention. In this embodiment, graded region 127 of semiconductor device 108 includes a plurality of films 186 to 186+n disposed upon substrate 140. Each film 186 to 186+n in the plurality of films may comprise a varied material composition (e.g., specific proportions of silicon, metals, oxides, Nitrogen, etc.). Films 186 to 186+n may be disposed upon substrate according to desired profile characteristics represented by material concentration profile G, defining the material composition profile of graded region 120. For example, in one embodiment, film 186 may be deposited at first portion 122 with a composition of substantially silicon, then a film 186+1 may be deposited on film 186 with a composition of about 95% to about 99% silicon, and about 1% to about 5% silicate (e.g., hafnium). As multiple layers are deposited on substrate 140 the proportions of silicon hafnium and any number of other materials and chemicals may be varied to control the material concentration profile of graded region 120. In one embodiment, film 186+n may include hafnium nitride, thereby forming a high-K metal gate 172.

Figure 16:
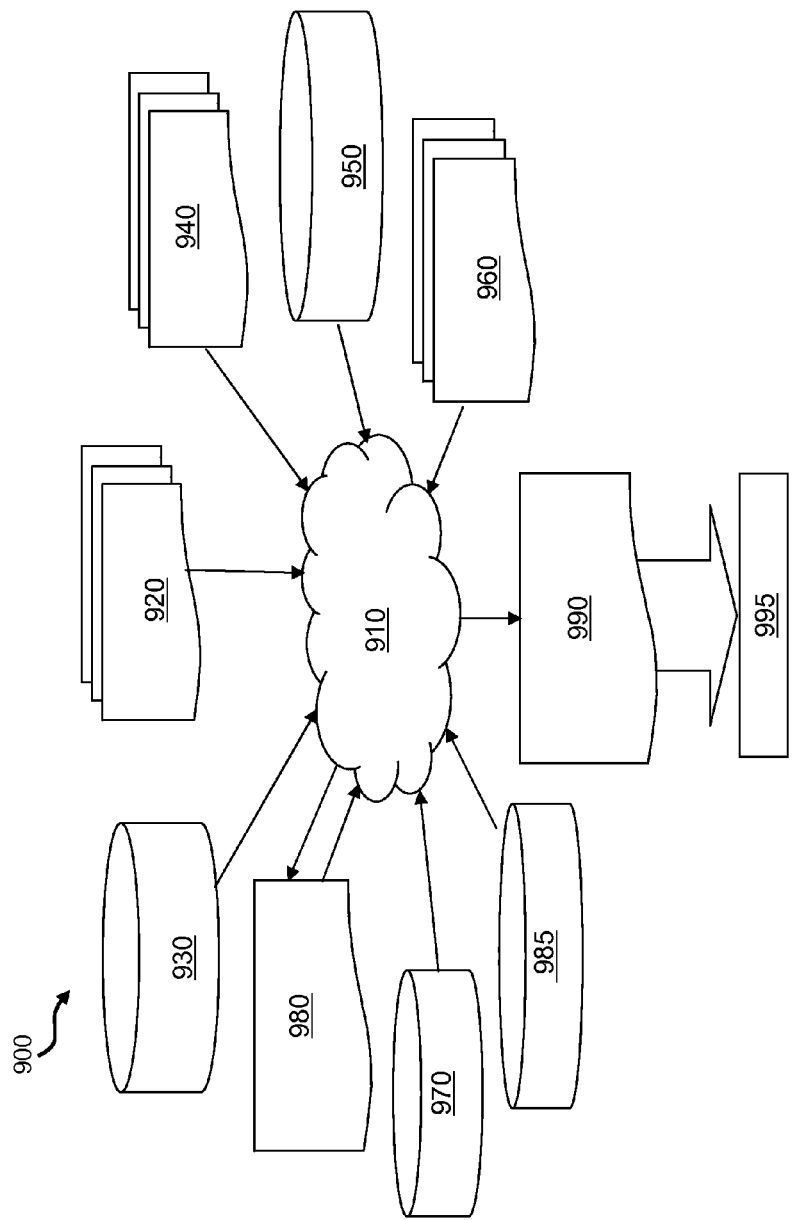
FIG. 16 is a demonstrative illustration of a flow diagram of a design process used in semiconductor design, manufacture, and/or test according to embodiments of the invention.

FIG. 16 is a demonstrative illustration of a flow diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIG. 1. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA).

FIG. 16 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 1. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 1 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1. In one embodiment, design structure 990 may comprise a compiled, executable HDL simulation model that functionally simulates the devices shown in FIG. 1.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1. Design structure 990 may then proceed to a stage 995 where, for example, design structure 990: proceeds to tape-out, is released to manufacturing, is released to a mask house, is sent to another design house, is sent back to the customer, etc.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A semiconductor device comprising:
 a substrate; and
 a gate structure disposed directly on the substrate, the gate structure including:
  a graded region with a varied material concentration profile, wherein the graded region contains magnesium (Mg), the graded region including:
   a first portion in direct contact with a top surface of the substrate and a second portion proximate to and directly under the metal layer, the first portion comprising substantially silicon and the second portion comprising substantially metal; and
  a metal layer disposed on the graded region.

2. The semiconductor device of claim 1, wherein the graded region further contains at least one of aluminum (Al), lanthanum (La), aluminum oxide ($Al_2O_3$), lanthanum oxide ($La_2O_3$), and zirconium oxide ($Zr_2O_3$).

3. The semiconductor device of claim 1, wherein a concentration of each material in the graded region varies linearly.

4. The semiconductor device of claim 1, wherein a concentration of each material in the graded region varies exponentially.

5. The semiconductor device of claim 1, wherein the graded region includes a plurality of films, the plurality of films having a varied material composition relative one another.

6. A design structure tangibly embodied in a machine readable medium for design, manufacturing, or testing a semiconductor device, the design structure comprising:
   a substrate; and
   a gate structure disposed directly on the substrate, the gate structure including:
      a graded region with a varied material concentration profile, wherein the graded region contains magnesium (Mg), the graded region including:
         a first portion in direct contact with a top surface of the substrate and a second portion proximate and directly under the metal layer, the first portion comprising substantially silicon and the second portion comprising substantially metal; and
      a metal layer disposed on the graded region.

7. The design structure of claim 6, wherein the graded region further contains at least one of aluminum (Al), lanthanum (La), aluminum oxide ($Al_2O_3$), lanthanum oxide ($La_2O_3$), and zirconium oxide ($Zr_2O_3$).

8. The design structure of claim 6, wherein the graded region includes a plurality of films, the plurality of films having a varied material composition relative one another.

* * * * *